US007361869B2

(12) United States Patent
Russegger

(10) Patent No.: US 7,361,869 B2
(45) Date of Patent: Apr. 22, 2008

(54) METHOD FOR THE PRODUCTION OF AN ELECTRICALLY CONDUCTIVE RESISTIVE LAYER AND HEATING AND/OR COOLING DEVICE

(75) Inventor: Elias Russegger, Golling (AT)

(73) Assignee: Watlow Electric Manufacturing Company, St. Louis, MO (US)

( * ) Notice: Subject to any disclaimer, the term of this patent is extended or adjusted under 35 U.S.C. 154(b) by 0 days.

(21) Appl. No.: 10/872,752

(22) Filed: Jun. 21, 2004

(65) Prior Publication Data

US 2005/0025470 A1 Feb. 3, 2005

Related U.S. Application Data

(63) Continuation of application No. PCT/EP02/14310, filed on Dec. 16, 2002.

(30) Foreign Application Priority Data

Dec. 19, 2001 (DE) ................................ 101 62 276

(51) Int. Cl.
*H05B 3/16* (2006.01)
*H01L 17/06* (2006.01)

(52) U.S. Cl. ......................................... 219/543; 29/620

(58) Field of Classification Search ................ 219/543, 219/522, 548, 517, 203, 469–471, 476–478; 338/307–309, 292–293; 392/438–439; 29/620; *H05B 3/16; H01C 17/06*
See application file for complete search history.

(56) References Cited

U.S. PATENT DOCUMENTS 1,767,715 A * 6/1930 Stoekle ........................ 338/300
2,022,314 A * 11/1935 Heyroth et al. ............. 338/309
2,622,178 A * 12/1952 Glynn ......................... 338/217
2,623,971 A * 12/1952 Glynn ......................... 219/539
2,673,142 A * 3/1954 Glynn ......................... 216/42
2,842,464 A * 7/1958 Dickinson et al. ............ 216/16
2,859,321 A * 11/1958 Garaway ..................... 338/255
2,878,357 A * 3/1959 Thomson et al. ........... 338/292
3,417,229 A * 12/1968 Shomphe et al. ........... 219/528
3,564,475 A * 2/1971 Fujii et al. .................. 338/120
3,864,545 A * 2/1975 Schafer et al. .............. 219/203
4,016,645 A * 4/1977 Cooke .......................... 29/611
4,034,207 A * 7/1977 Tamada et al. ............. 219/517
4,073,970 A * 2/1978 Allen ......................... 427/96.5
4,297,670 A * 10/1981 Solow ......................... 338/195
4,936,145 A * 6/1990 Hohenstatt ............... 73/204.26
5,065,193 A * 11/1991 Saitoh et al. ............... 399/324
5,331,134 A * 7/1994 Kimura ....................... 219/543

(Continued)

FOREIGN PATENT DOCUMENTS

DE 235132 * 4/1986

(Continued)

*Primary Examiner*—Daniel L. Robinson
(74) *Attorney, Agent, or Firm*—Brinks Hofer Gilson & Lione

(57) ABSTRACT

An electrically conductive resistive layer (26) is produced by thermally spraying an electrically conductive material (18) onto the surface of a non-conductive substrate (12). Initially, the material layer (14) arising therefrom has no desired shape. The material layer (14) is then removed (24) in certain areas so that an electrically conductive resistive layer (26) having said desired shape is produced.

12 Claims, 3 Drawing Sheets

U.S. PATENT DOCUMENTS

| | | | | | |
|---|---|---|---|---|---|
| 5,351,536 | A | * | 10/1994 | Uchiyama | 73/204.26 |
| 5,587,097 | A | * | 12/1996 | Sato et al. | 219/543 |
| 5,616,266 | A | * | 4/1997 | Cooper | 219/407 |
| 5,750,958 | A | * | 5/1998 | Okuda et al. | 219/267 |
| 5,804,797 | A | * | 9/1998 | Kaimoto et al. | 219/505 |
| 6,096,995 | A | * | 8/2000 | Toyota et al. | 219/216 |
| 6,101,298 | A | * | 8/2000 | Den Broeder et al. | 385/16 |
| 6,376,816 | B2 | * | 4/2002 | Cooper et al. | 219/543 |
| 6,448,538 | B1 | * | 9/2002 | Miyata | 219/444.1 |
| 2001/0003336 | A1 | * | 6/2001 | Abbott et al. | 219/543 |
| 2003/0116559 | A1 | * | 6/2003 | Park | 219/543 |

FOREIGN PATENT DOCUMENTS

| | | | |
|---|---|---|---|
| DE | 3708577 | * | 9/1988 |
| GB | 2186769 | * | 8/1987 |
| JP | 58-89380 | * | 5/1983 |
| JP | 59-175580 | * | 10/1984 |
| JP | 3-295185 | * | 12/1991 |
| JP | 4-33288 | * | 2/1992 |
| JP | 5-307926 | * | 11/1993 |
| JP | 8-101592 | * | 4/1996 |
| NL | 1000729 | * | 1/1997 |
| WO | 98/19499 | * | 5/1998 |

* cited by examiner

METHOD FOR THE PRODUCTION OF AN ELECTRICALLY CONDUCTIVE RESISTIVE LAYER AND HEATING AND/OR COOLING DEVICE

CROSS-REFERENCE TO RELATED APPLICATIONS

The present application is a continuation of PCT application number PCT/EP02/14310, titled "Method for the Production of an Electrically Conductive Resistive Layer and Heating and/or Cooling Device" filed Dec. 16, 2002, which claims priority from German application number DE 10162276.7, filed Dec. 19, 2001.

FIELD OF THE INVENTION

The invention at first covers a method to produce an electrically conductive resistance layer on which an electrically conductive material will be applied, by means of thermal spraying, to a non conductive substrate.

BACKGROUND OF THE INVENTION

Such a method is already known from the DE 198 10 848 A1 patent. This patent describes a heating element which is produced by applying on the surface of a substrate through a plasma-spray method or an electrical arcing method band-shaped layers of an electrical conductive and resistance creating material. To achieve the desired shape of the electrical conductive layer, a separation layer is applied first to the substrate by means of a printing method. The separation layer is from such a material that, it does not bond with the electrically conductive layer on those parts of the substrate where it is present.

The known method has the disadvantage that it is relatively complex and therefore the parts with the electrically conductive resistance layers are comparably expensive. In addition to this, only more or less level surfaces can be covered with an electrically conductive layer.

The invention at hand therefore is to further develop the previously described method in a way that the production of a substrate with an electrically conductive layer can be performed more easily and cheaper and that also complex-shaped objects can be applied with an electrically conductive resistance layer as well.

SUMMARY OF THE INVENTION

This task is accomplished through a method in the initially mentioned art by applying the electrically conductive material to the surface of the substrate in such a manner so that the applied material layer at first does not necessarily show the desired shape but that later the material layer will be taken-off in a way that an electrically conductive resistance layer is created which in essentially shows the desired shape.

For the invented method no special pre-treatment is necessary to get to the desired shape of the electrically conductive resistance layer. Instead the electrically conductive material which forms the resistance layer is surface-applied essentially evenly to the electrically non-conductive substrate. The application through thermal spraying cares for the high adhesion of the electrically conductive material to the electrically non-conductive substrate. In addition, different materials can be applied quickly and very evenly in this way to the electrically non-conductive surface.

After that, the electrically conductive material will be taken-off with an appropriate device from certain areas. In this way, even complex shaping of the electrically conductive layer is achieved in only 2 work-steps.

Advantageous additional features of the invention are stated in sub-claims.

It is proposed that first the material layer be removed from certain areas by means of a laser beam or a water jet or a powder sand blast.

Using a laser beam, the material will be greatly heated which causes it to evaporate. The use of a laser has the advantage that very quickly very high doses of energy can be brought to the electrically conductive material so that it immediately evaporates. Due to the instant evaporation of the electrically conductive material it is assured that only relatively little heat will be brought to the surface which lies underneath the electrically conductive material. That surface will not be damaged by the method contained in this invention. The evaporation has—compared to burning—the advantage that generally no residues remain on the surface of the evaporated areas which makes their insulation effect very good.

With the appropriate optics of the device which sends out the laser beam the beam can be directed in an almost unlimited way to the subject. Therefore randomly complex contours can be evaporated from the electrically conductive material so that correspondingly complex electrical resistance layers can be manufactured. In addition even such subjects which themselves are complex three-dimensionally shaped can be worked-on. Therefore, an electrically conductive resistance layer of complex geometry can be manufactured in only two work-steps.

Using a water jet will bring no thermal energy to the subject at all. This is especially advantageous when treating heat sensitive plastics. The same is applicable when utilizing powder sand blasting.

In another especially preferred further development of the invention it is proposed that during the removal of the material layer the electrical resistance of the electrically conductive resistance layer is at least indirectly obtained. This way a precise quality control is immediately possible during the production of the electrically conductive layer.

In further development to this it is proposed to compare the actual resistance value of the electrically conductive resistance layer to a set value and to reduce the difference between set value and actual value by additional removal of the electrically conductive layer. This has the advantage that already during production of the electrically conductive layer deviations from the desired resistance can be adjusted.

Such deviations can be created for example when during spraying of the thermally conductive material inconsistent amounts of the electrically conductive material are applied to some areas of the surface in a way that in those areas the thickness of the electrically conductive layer gets to a different thickness than in other areas. With the proposed method deviations of the actual value to the set value can be adjusted up to a precision of ±1%. The additional removal of zones of electrically conductive material can either imply a shortage or an elongation of the electrically conductive layer and/or it can imply a change in the width of the electrically conductive layer.

Herewith it is again especially advantageous when the collection of the actual value of the electrical resistance of the electrically conductive resistance layer and reduction in the difference between the actual value and the set value is being done simultaneously. This is possible, because already during the processing of the electrically conductive layer with a laser beam the electrical resistance value of the electrically conductive layer can be measured. If this method is applied during production of the electrically conductive layer time and consequently money can be saved.

In an embodiment of the method according to the invention it is proposed that the material-layer be removed in such a way that at least at one spot of the electrically conductive layer, an intended melting spot is created that functions as the melting fuse. Such an integrated melting fuse increases the electrical safety of the electrically conductive resistance layer. That way the melting fuse can be incorporated into the electrically conductive layer practically without any additional cost and expenditure of time.

It is also advantageous, when the material layer is removed in such a manner that the electrically conductive resistance layer at least in some areas has the shape of a meander. This enables the creation of a possibly long electrically conductive layer on a small area.

It is also proposed that after the removal of some areas of the electrically conductive material and the completion of the electrically conductive resistance layer, the layer be applied by an electrically non-conductive intermediate layer. Next on top of the intermediate electrically non-conductive layer another electrically conductive layer can be thermal sprayed in such a way that it essentially does not show the desired shape yet. After this, using a laser beam the material layer will be removed in some areas so a second electrically conductive layer is created which has the desired shape. The invention allows therefore the use of several layers on top of each other. It must be noted that the invention not only covers an application with two electrically conductive resistance layers but also is applicable to any desired number of arranged resistance layers.

The electrically conductive material comprise preferably Bismuth (Bi), Tellurium (Te), Germanium (Ge), Silicon (Si) and/or Gallium Arsenite. These materials proved to be well suitable for thermal spraying and the following treatment with laser beams. Furthermore, with these materials the known pertinent technical effects are realizable.

Well suitable for applying electrically conductive materials on the substrate are plasma-spraying, high speed flame spraying, arc spraying, autogenious spraying, laser spraying or cold gas spraying.

Furthermore it is proposed to apply the electrically conductive material and to remove the material layer in certain areas and that such a material is used in a way that an electrical heating layer or an electrical cooling layer is created. In the production of an electrical cooling layer the "Peltier effect" is beneficially used.

One further beneficial embodiment is proposed so that the local electrical resistance of the electrically conductive resistance layer will be adjusted by means of local heat treatment. Through heating local oxides can be brought into the layer, which affects the local electrical conductivity of the material. This makes a specially precise and fine tuning of the electrical resistance possible.

It is also beneficial when the electrically conductive layer gets sealed. This is especially advantageous on porous substrates (for example metal with an intermediate layer of Al2O3). Sealing decreases the risk of electrical sparking due to moisture especially at high voltages. Suitable materials to seal the surface are Silicone, Polyimide, soluble Potassium or soluble Sodium. They can be applied through plunging, spraying, painting etc. The tightness of the seal is best when the sealing layer is applied under vacuum.

Electrically non-conductive substrates can also be glass or glass-ceramics. The electrically conductive resistance layer can be plasma-sprayed to these materials durably. Due to the good electrical insulation of glass it is unnecessary to ground the resistance layer. Also possible is the use of special high temperature glass such as for example Ceranglas®.

The invention also applies to a heating- and/or cooling device with a non conductive substrate and an electrically conductive resistance layer which is thermally sprayed on the substrate.

Manufacturing cost for such a heat- and/or cooling device can be reduced when the resistance layer envelops an electrically conductive material, which is surface-applied through thermal spraying and then removed by a laser beam from certain areas and brought into the desired shape.

Next especially preferred embodiments of the invention illustrate design examples the invention with reference to the attached drawings. The drawings display:

BRIEF DESCRIPTION OF THE DRAWINGS

FIG. 1 is a perspective layout of a tube on which an electrically conductive material is sprayed-on;

DETAILED DESCRIPTION OF THE PREFERRED EMBODIMENTS

Figure 1:
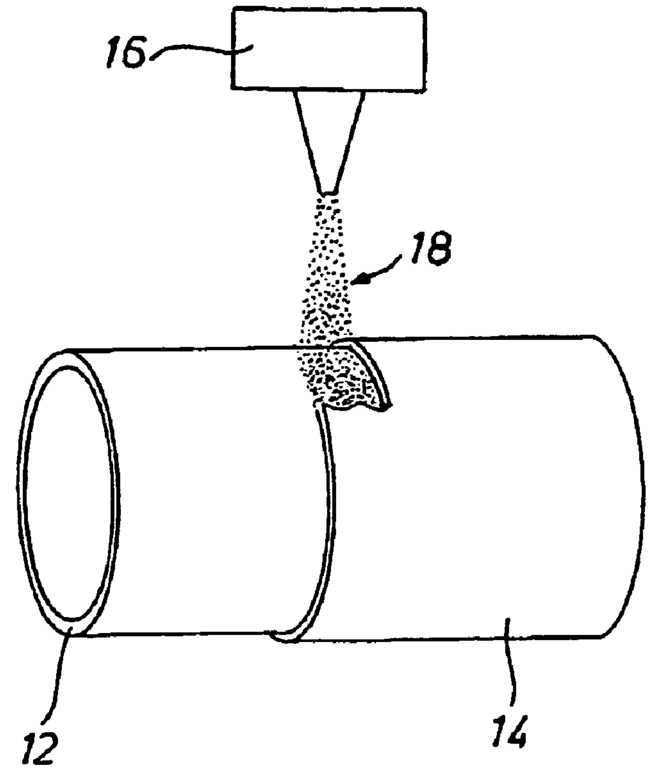
Figure 2:
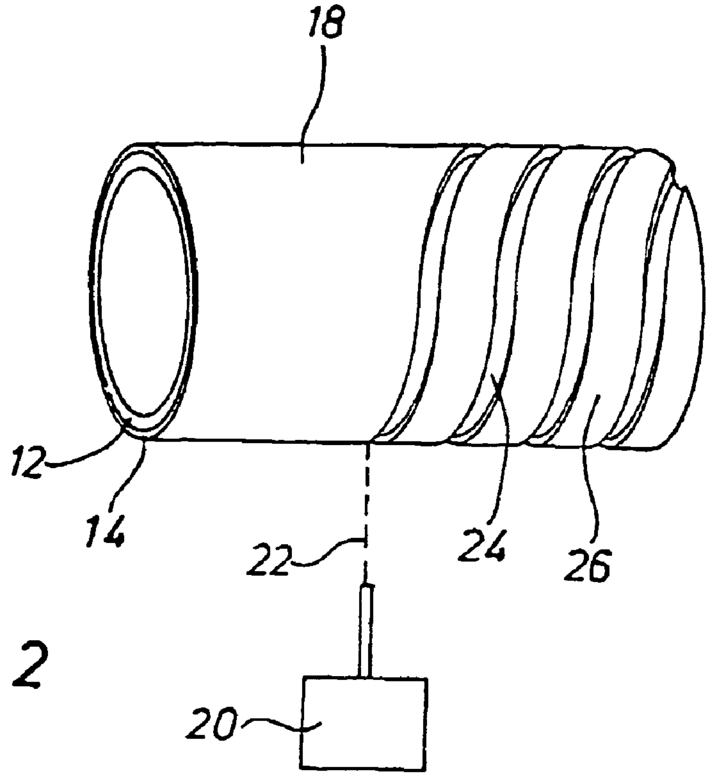
FIG. 2 is the tube of FIG. 1. Its electrically conductive layer is worked-on with laser beams.

FIGS. 1 and 2 show the production of a tube shaped flow heater. On a high temperature resistant tube (12), i.e., complex three-dimensionally shaped geometry or substrate, with an electrically non-conductive material, an electrically conductive layer is applied (FIG. 1). The application is conducted by means of a device (16) which is used to spray particles of Germanium (Ge) (18) on the tube (12). In this case, cold-gas-spray method is used.

In the spraying process the unmolten particles of Germanium (Ge) are accelerated to speeds of 300-1200 m/sec and sprayed on to the tube (12). On impact the Ge-particles (18) as well as the surface of the tube get deformed. Because of the impact surface-oxides of the surface of the tube (12) get broken-up. Through micro-friction because of the impact the temperature of the contact area increases and leads to micro-welding.

The acceleration of the Ge-particles (18) is done by means of a conveyor-gas whose temperature can be slightly increased. Although the Ge-powder (18) never reaches its melting temperature, the resulting temperatures on the surface of the tube (12) are relatively moderate so that for example the tube can be made from a relatively cheap plastic material.

In other, not displayed construction examples, methods other than cold-gas-spraying can be used such as plasma-spraying, high-speed-flame-spraying, arc-spraying, autogenious-spraying or laser-spraying to apply the electrically conductive material to the substrate. Instead of Germanium (Ge), also Bismuth (Bi), Tellurium (Te), Silicon (Si) and/or Gallium Arsenide can be used, depending on the desired technical effect.

The coating of the tube (12) with particles of Germanium (Ge) is done at first in a way that bit by bit the entire surface of the tube (12) is covered with the Germanium-layer (14) (compare FIG. 1). This material layer however does not have the desired shape yet: To be able to manufacture a tubular shaped flow heater an electrically conductive resistance layer must be produced which surrounds the tube (12) in a circumferential direction in a spiral shape. To achieve this, as can be seen in FIG. 2, a laser beam is directed to the "unshaped" material layer in a way that a spiral-shaped area (24) around the tube (12) is created in which the sprayed-on electrically conductive material (14) is not present any more.

This is achieved by having the material in the material layer (14) met with the laser beam so that it heats and immediately evaporates that part of the layer (14). The laser device on one side and a—in the figure not shown—device which holds the tube (12) is one the other so that a continuing work process by the laser device (20) is possible.

Figure 3:
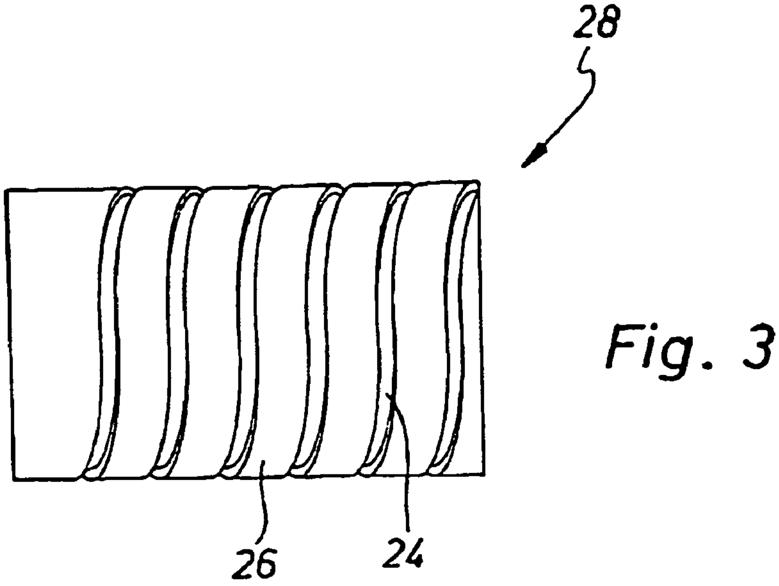
FIG. 3 is a side view of the tube of FIG. 2 after completion.

As can be seen from FIG. 3, an electrically conductive layer (26) is created, that stretches spirally from one axial end of the tube (12) to the other. The flow heater (28) is formed by the electrically conductive resistance layer (26) and the tube (12).

Figure 4:
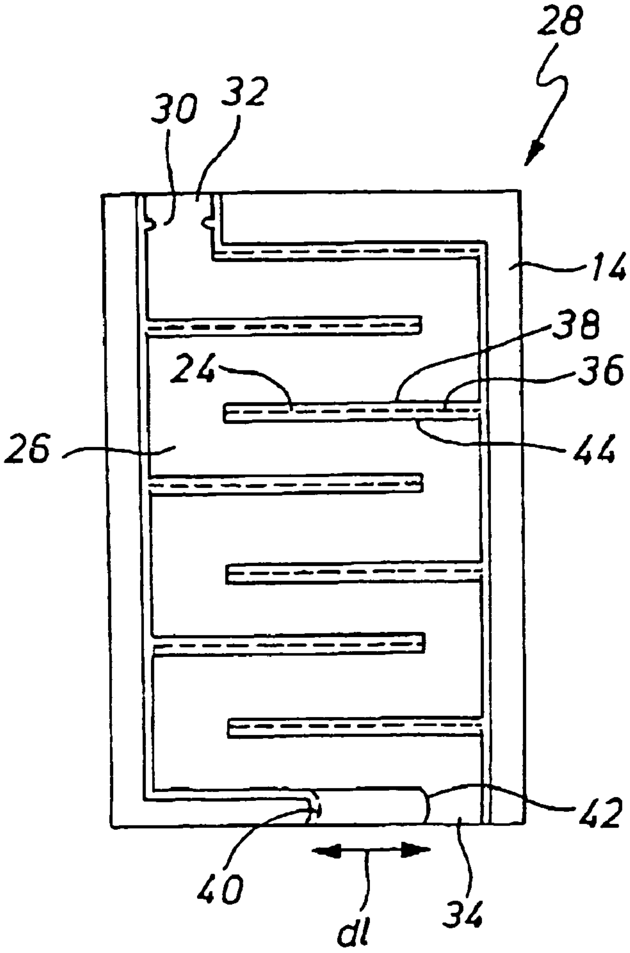
FIG. 4 is the top view on a plate-shaped part with a meander-shaped electrically conductive resistance layer.

In FIG. 4 a flat heat plate (28) is shown from a top view. This consists of a—in this view not visible—non conductive substrate on which, analog to the described process of FIG. 1 and 2 at first a sheet-shaped layer of material (14) gets applied, out of which certain areas (24) are being evaporated with a laser beam (for simplicity only one area (24) was marked). Hereby a meander shaped electrically conductive resistance layer (26) was created that stretches from one end of the plate (28) to the other. This, however, has two specialties:

On the upper end of FIG. 4 the material layer (14), from which the electrically conductive layer was produced, was evaporated in a way that the conductive track (26) shows a narrowed section. This creates a melting fuse (30) in such a way that the use of the heater plate (28) is protected.

The second specialty is that the heating capacity or as the case may be the density of the heat flow was corrected during manufacturing that it corresponds to the desired heat capacity or as the case may be the desired heat flow to very high precision. This is achieved as follows: A voltage is applied to the ends 32 and 34 of the electrically conductive resistance layer (26) during the evaporation process so that the electrical resistance of the electrically conductive layer (26) can be measured continuously. The material layer (14) will be evaporated by the laser beam at first in only small sections (24). The horizontal layers of the evaporated areas (24) of FIG. 4 stretch only from a corner (dashed lines) (36) to the horizontal corner (38) of the electrically conductive layer (26) which lies above. (Also here because of illustration purposes only one area (24) is shown). In addition to this, the material layer (14) is processed by the laser beam in a way that the lower electrical end area (34) becomes relatively broad. This is shown with a dotted line with the mark 40.

Figure 5:
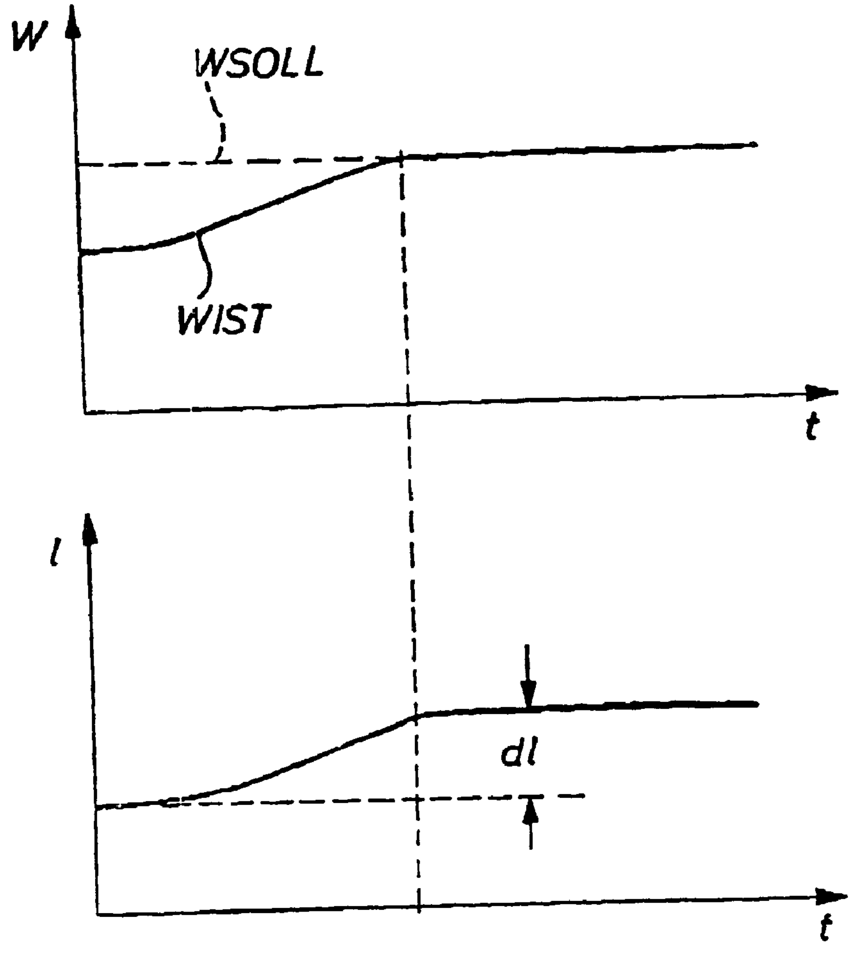
FIG. 5 is two diagrams. One shows the progression of time of the electrical resistance and the other shows the progression of time of the length of the electrically conductive resistance layer from FIG. 4 during manufacturing.

During the evaporation of the areas (24) of the material layer (14) of our present example, it is noted by measuring the resistance of the created layer (26), that the actual electrical resistance WIST (compare FIG. 5) of the electrically conductive layer is lower than the desired electrical resistance WSOLL. Shown in FIG. 4, the lower connection area (34) of the electrically conductive resistance layer (26) is processed by the laser beam in a way that his width decreases. Additional material is evaporated. Herewith the length of the electrically conductive resistance layer (26) increases with the dimension dl (compare FIG. 4 and 5) thus increasing the electrical resistance WIST until it corresponds exactly with the desired electrical resistance WSOLL. The final position of the limiting line of the lower connection (34) is marked in FIG. 4 with the number 42.

To adjust the density of the heat flow the evaporated areas (24) shown in FIG. 4 are increased. The final limitation at which the desired density of the heat flow corresponds to the desired density of the heat flow of the electrically conductive layer (26) is marked in FIG. 4 with the number 44 [for simplicity reasons only shown once in evaporated area (24)].

Figure 6:
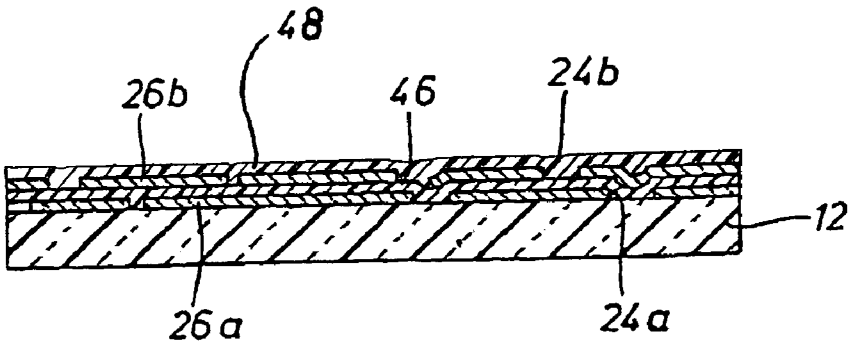
FIG. 6 shows a section through the plate-shaped part with 2 electrically conductive resistance layers arranged one above the other.

FIG. 6 shows a plate-shaped heating device in a cross section. In contrary to the examples described above, it does not only show one electrically conductive resistance layer but two electrically conductive resistance layers (**26*a* and 26*b*). Between these layers, and above layer 26*b*, electrically non conductive intermediate layers (46) and (48) are positioned. The manufacturing process of these electrical heating plates (28**) is described as follows:

At first an electrically conductive material is applied to the plate shaped substrate (12) as described above. The material is surface-applied by thermal spraying it in a way that at first the material layer does not show the desired shape in general yet. Following this process the material layer (**24*a*) gets evaporated by laser beam in such a way that an electrically conductive resistance layer (26*a***) is created which does show the desired shape.

On top of the finished electrically conductive resistance layer **26*a* an electrically isolating intermediate layer (46) gets applied in a following work step. Then the procedure described above gets repeated which means that, again, electrically conductive material is surface-applied by thermal spraying on top of the non conductive intermediate layer (46) in a way that the so created second material layer does not show the desired shape yet. This layer is then processed by a laser beam in certain areas (24*b*) in such a way that a second electrically conductive resistance layer (26*b***) is created which does show the desired shape.

The material in a non shown example was chosen in a way that—instead of an electrical heating layer—an electrical cooling layer is created.

In another not illustrated example, the temperature of the heating layer is controlled by a ceramic switch. In this case, it is understood to mean a non mechanical switch, which consists of an element, whose conductivity is highly dependent on its temperature. Alternatively, a bimetal switch can be used as well.

What is claimed is:

1. A heater adapted for fixed placement proximate a separate and external part or medium to be heated and defining a shape commensurate with the part or medium to be heated, the heater comprising:

a complex shaped substrate;

a nonconductive layer formed over the substrate; and an electrically conductive resistive layer formed on the nonconductive layer by a process of forming a material in the form of particles onto the nonconductive layer and subsequently and selectively removing areas of the material using a laser to form a complex contour pattern, wherein removing areas of the material creates a desired resistance of the electrically conductive resistive layer such that at least a portion of the particles are micro-welded along a length of the pattern and local oxides are brought into the pattern to fine tune an electrical resistance along the length of the pattern.

2. The heater according to claim 1 further comprising a sealing layer formed over the electrically conductive resistive layer.

3. The heater according to claim 1 further comprising an electrically nonconductive intermediate layer formed over the electrically conductive resistive layer, and a second electrically conductive resistive layer formed over the electrically nonconductive intermediate layer, wherein the second electrically conductive resistive layer is formed by the same process as the electrically conductive resistive layer.

4. The heater according to claim 1 further comprising a plurality of electrically conductive resistive layers separated by a corresponding plurality of electrically nonconductive intermediate layers.

5. The heater according to claim 1, wherein the substrate is a glass material.

6. The heater according to claim 1, wherein the electrically conductive resistive layer is a material is selected from a group consisting of Bismuth (Bi), Tellurium (Te), Germanium (Ge), Silicon (Si), and Gallium Arsenide.

7. The heater according to claim 1, further comprising a limiting line defining a length, the limiting line disposed at one end of the pattern of the electrically conductive resistive layer, wherein the length of the limiting line is adjusted to fine tune the resistance of the electrically conductive resistive layer.

8. A heater adapted for fixed placement proximate a separate and external part or medium to be heated and defining a shape commensurate with the part or medium to be heated, the heater comprising:

a complex shaped substrate; and an electrically conductive resistive layer formed on the complex shaped substrate by a process of forming a material in the form of particles onto the complex shaped substrate and subsequently and selectively removing areas of the material using a laser to form a complex contour pattern, wherein removing areas of the material creates a desired resistance of the electrically conductive resistive layer such that at least a portion of the particles are micro-welded along a length of the pattern and local oxides are brought into the pattern to fine tune an electrical resistance along the length of the pattern.

9. The heater according to claim 8 further comprising a sealing layer formed over the electrically conductive resistive layer.

10. The heater according to claim 8 further comprising an electrically nonconductive intermediate layer formed over the electrically conductive resistive layer, and a second electrically conductive resistive layer formed over the electrically nonconductive intermediate layer, wherein the second electrically conductive resistive layer is formed by the same process as the electrically conductive resistive layer.

11. The heater according to claim 8 further comprising a plurality of electrically conductive resistive layers separated by a corresponding plurality of electrically nonconductive intermediate layers.

12. The heater according to claim 8, further comprising a limiting line defining a length, the limiting line disposed at one end of the pattern of the electrically conductive resistive layer, wherein the length of the limiting line is adjusted to fine tune the resistance of the electrically conductive resistive layer.

* * * * *